(12) United States Patent
Lee et al.

(10) Patent No.: US 11,844,175 B2
(45) Date of Patent: Dec. 12, 2023

(54) STRETCHABLE SUBSTRATE HAVING IMPROVED STRETCH UNIFORMITY AND METHOD OF MANUFACTURING THE SAME

(71) Applicant: Korea Institute of Science and Technology, Seoul (KR)

(72) Inventors: Phillip Lee, Seoul (KR); SeungJun Chung, Seoul (KR); HeeSuk Kim, Seoul (KR); JeongGon Son, Seoul (KR); SukJoon Hwang, Seoul (KR)

(73) Assignee: Korea Institute of Science and Technology, Seoul (KR)

( * ) Notice: Subject to any disclaimer, the term of this patent is extended or adjusted under 35 U.S.C. 154(b) by 0 days.

(21) Appl. No.: 17/703,277

(22) Filed: Mar. 24, 2022

(65) Prior Publication Data

US 2023/0217587 A1 Jul. 6, 2023

(30) Foreign Application Priority Data

Dec. 31, 2021 (KR) .......................... 10-2021-0193783

(51) Int. Cl.
*H05K 1/02* (2006.01)
*H05K 1/03* (2006.01)
(Continued)

(52) U.S. Cl.
CPC ............. *H05K 1/0283* (2013.01); *H05K 3/00* (2013.01); *H05K 2201/09063* (2013.01)

(58) Field of Classification Search
CPC .......... H05K 1/02; H05K 1/0283; H05K 1/03; H05K 1/036; H05K 3/00; H05K 3/0011; H05K 3/4697; H05K 2201/0116; H05K 2201/0133; H05K 2201/09063; A41D 1/00; A41D 1/06; A41D 13/00; A41D 13/05; A42B 1/08; A42B 1/22; A42B 1/041; A43B 23/028; A43B 23/042; A43B 23/0215;
(Continued)

(56) References Cited

U.S. PATENT DOCUMENTS 7,678,440 B1 * 3/2010 McKnight ................. B32B 3/26
148/563
10,195,815 B2 * 2/2019 Toronjo ................. A42B 1/041
(Continued)

FOREIGN PATENT DOCUMENTS

KR 10-2018-0061003 A 6/2018
KR 10-2021-0073647 A 6/2021
(Continued)

OTHER PUBLICATIONS

A Notice of Allowance mailed by the Korean Intellectual Property Office dated Aug. 22, 2022, which corresponds to Korean Patent Application No. 10-2021-0193783 and is related to U.S. Appl. No. 17/703,277.

*Primary Examiner* — Xiaoliang Chen
(74) *Attorney, Agent, or Firm* — Studebaker & Brackett PC

(57) ABSTRACT

Disclosed is a method of manufacturing a stretchable substrate having improved stretch uniformity according to various embodiments of the present disclosure in order to implement the above-described object. The method may include forming an auxetic including a plurality of unit structures, and attaching one or more elastic sheets to the auxetic and forming a stretchable substrate.

8 Claims, 12 Drawing Sheets

(51) Int. Cl.
*H05K 3/00* (2006.01)
*A41D 1/00* (2018.01)
*A41D 1/06* (2006.01)
*A41D 13/00* (2006.01)
*A41D 13/05* (2006.01)
*A42B 1/08* (2006.01)
*A42B 1/22* (2006.01)
*A42B 1/041* (2021.01)

(58) Field of Classification Search
CPC ... B32B 38/08; B32B 38/145; B32B 2437/00; B32B 2071/1208; B32B 2071/1258; B32B 2307/51; B32B 2571/00
USPC .................................. 174/254; 2/69; 36/45
See application file for complete search history.

(56) References Cited

U.S. PATENT DOCUMENTS

| | | | | |
|---|---|---|---|---|
| 10,549,505 | B2* | 2/2020 | Tibbits | B32B 3/266 |
| 2006/0163431 | A1* | 7/2006 | Dittrich | B64C 3/26 |
| | | | | 244/126 |
| 2008/0248710 | A1* | 10/2008 | Wittner | D04H 3/16 |
| | | | | 156/60 |
| 2010/0330330 | A1* | 12/2010 | Luca | B29C 44/5654 |
| | | | | 428/137 |
| 2012/0241312 | A1* | 9/2012 | Keefe | B29C 59/02 |
| | | | | 204/242 |
| 2014/0059734 | A1* | 3/2014 | Toronjo | A43B 3/26 |
| | | | | 2/69 |
| 2014/0101816 | A1* | 4/2014 | Toronjo | A42B 1/041 |
| | | | | 36/83 |
| 2014/0109286 | A1* | 4/2014 | Blakely | A43B 23/0215 |
| | | | | 2/69 |
| 2014/0276995 | A1* | 9/2014 | Lau | A61F 2/0063 |
| | | | | 606/151 |
| 2015/0073324 | A1* | 3/2015 | Liebe | A61F 13/00034 |
| | | | | 428/101 |
| 2015/0073369 | A1* | 3/2015 | Hippe | A61F 13/00034 |
| | | | | 604/385.01 |
| 2015/0073372 | A1* | 3/2015 | Hippe | B32B 7/05 |
| | | | | 604/385.16 |
| 2016/0067939 | A1* | 3/2016 | Liebe | A61F 13/49011 |
| | | | | 428/101 |
| 2017/0099900 | A1* | 4/2017 | Toronjo | A43B 23/027 |
| 2017/0156443 | A1* | 6/2017 | Guyan | A43B 23/027 |
| 2017/0182732 | A1* | 6/2017 | Toronjo | A45F 3/12 |
| 2018/0199651 | A1* | 7/2018 | Blakely | A41D 31/04 |
| 2018/0325216 | A1* | 11/2018 | Toronjo | A43B 23/0265 |
| 2019/0380439 | A1* | 12/2019 | Toronjo | A45F 3/12 |
| 2020/0187858 | A1* | 6/2020 | Han | A61B 5/442 |
| 2020/0361590 | A1* | 11/2020 | Melo | B64B 1/58 |
| 2021/0227935 | A1* | 7/2021 | Webster | B32B 27/302 |
| 2021/0386151 | A1* | 12/2021 | Blakely | A42B 1/22 |
| 2021/0399203 | A1* | 12/2021 | Farhangdoust | H10N 30/302 |
| 2021/0399658 | A1* | 12/2021 | Farhangdoust | G01M 5/0066 |
| 2021/0401118 | A1* | 12/2021 | Toronjo | A43B 23/026 |
| 2021/0401119 | A1* | 12/2021 | Toronjo | A43B 23/026 |
| 2022/0053882 | A1* | 2/2022 | Toronjo | A43B 23/027 |
| 2022/0161462 | A1* | 5/2022 | Chung | B32B 7/022 |
| 2022/0161517 | A1* | 5/2022 | Lee | B32B 7/022 |
| 2022/0162060 | A1* | 5/2022 | Chung | H05K 1/0283 |

FOREIGN PATENT DOCUMENTS

| | | |
|---|---|---|
| KR | 10-2279065 B1 | 7/2021 |
| KR | 10-2279068 B1 | 7/2021 |

* cited by examiner

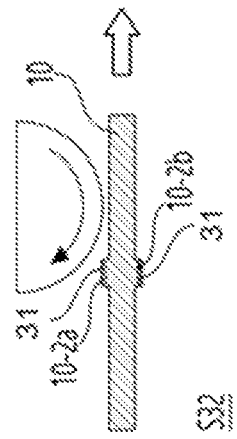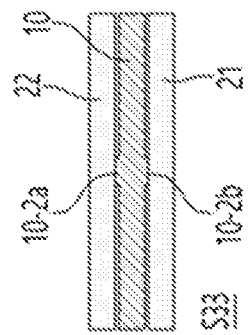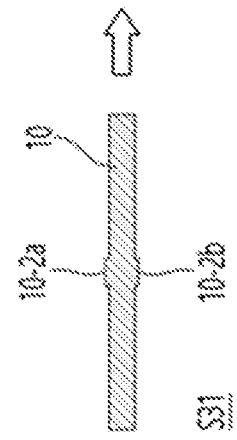
FIG. 14A
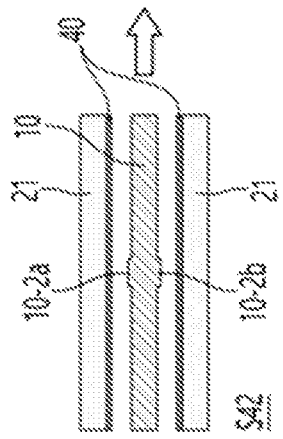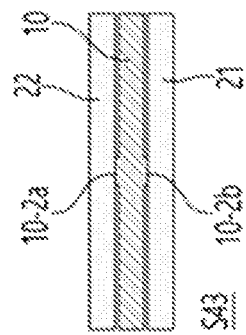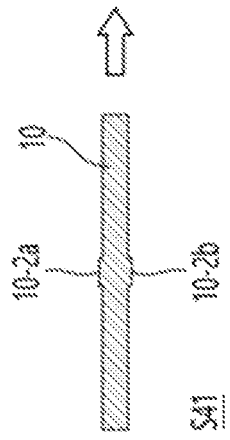
FIG. 14B

STRETCHABLE SUBSTRATE HAVING IMPROVED STRETCH UNIFORMITY AND METHOD OF MANUFACTURING THE SAME

CROSS-REFERENCE TO RELATED APPLICATION

This application claims priority to and the benefit of Korean Patent Application No. 10-2021-0193783, filed on Dec. 31, 2021, the disclosure of which is incorporated herein by reference in its entirety.

BACKGROUND

1. Field of the Invention

The present disclosure relates to a stretchable substrate, and more specifically, to a stretchable substrate in which, when an elastic substrate is provided with a mechanical metamaterial with a negative Poisson's ratio, a strain for each section of an entire surface of the corresponding elastic substrate is uniformly controllable, and a method of manufacturing the same.

2. Discussion of Related Art

In recent years, in addition to conductive elements in which electrodes are formed on a rigid substrate, research and development has been actively conducted on stretchable electronic elements in which electrodes are formed on a flexible substrate. Stretchable electronic elements are electronic elements that are manufactured on a substrate stretchable freely in response to external stress and are next-generation electronic elements that maintain the electrical/physical properties of an element even when mechanical deformation occurs or external force is applied. Such stretchable electronic elements may be applied to flexible devices, wearable devices, or the like and, furthermore, may be used as displays, sensors or electrodes attached to the human body, or the like.

Stretchable electronic elements may be most widely used in fields such as stretchable displays, stretchable solar cells, and stretchable energy storage/power generation devices. The stretchable electronic elements are showing potential as a next-generation technology that follows flexible displays. In addition, the stretchable electronic elements not only increase a degree of freedom in design due to excellent mechanical variability thereof but also secure mechanical stability against an external force, thereby expanding to markets such as wearable devices, electronic skin, smartphones, medical devices, healthcare monitoring systems, defense industries, and aerospace industries.

For a specific example, a display field is developed in a direction in which a degree of freedom of deformation is increased from a fixed flat/curved display to a flexible, foldable, or rollable display that is foldable or rollable in a single direction. Recently, as electronic devices have become smart and spatial mobility thereof is emphasized, there is a need to develop a stretchable display that is deformable in a multidimensional axis direction under various conditions and freely usable in addition to a fixed display.

As described above, it is expected that, with the advancement of technology related to a stretchable display field, the implementation of a new digital interface that goes beyond the existing method will be possible. For example, a stretchable substrate may be implemented through an elastic substrate, of which, when stretched in one axial direction, a strain in another axial direction is controllable, that is, through an elastic substrate having a negative Poisson's ratio.

However, in such a stretchable display, a negative Poisson's ratio is controllable in terms of the entirety of the substrate, but stress may be non-uniform for each pixel section. Specifically, in the case of a stretchable substrate using an auxetic structure, when the stretchable substrate is stretched, a strain may be controlled in an in-plane direction perpendicular to a stretching direction, but respective pixel sections may have different elongations.

When respective pixel sections of a stretchable display have different elongations in response to stretching in one direction, a distortion of pixels in the in-plane direction may be maximized. In addition, a warpage may be caused for each section of a stretchable element, mechanical separation of elements positioned on a stretchable substrate may be accelerated, thereby reducing a lifetime of the element.

Accordingly, in the art, there may be a demand for a stretchable substrate having a negative Poisson's ratio which is provided to control a strain in an in-plane direction perpendicular to a stretching direction and concurrently to minimize a distortion and a warpage by uniformizing an elongation distribution in the substrate.

SUMMARY OF THE INVENTION

The present disclosure is directed to providing a stretchable substrate in which a stretchable substrate having a negative Poisson's ratio is provided to control a strain in an in-plane direction perpendicular to a stretching direction and concurrently to minimize a distortion and a warpage by uniformizing an elongation distribution in the substrate.

The technical objects of the present disclosure are not limited to the above-described ones, and the other undescribed technical objects will become apparent to those skilled in the art from the following description.

According to an aspect of the present disclosure, there is provided a method of manufacturing a stretchable substrate having improved stretch uniformity including forming an auxetic including a plurality of unit structures, and attaching one or more elastic sheets to the auxetic and forming a stretchable substrate.

The method may include forming the auxetic including the plurality of unit structures, and attaching the one or more elastic sheets to the auxetic and forming the stretchable substrate.

In response to an external force generated in one axial direction, each of the plurality of unit structures may cause deformation of the auxetic in another axial direction.

The forming of the auxetic may include performing a printing process using an elastic material.

The forming of the auxetic may include forming the auxetic including the plurality of unit structures, each of which has a shape corresponding to a re-entrant structure.

The forming of the auxetic may include at least one of an operation of forming through-holes based on one or more coupling points included in each of the unit structures and an operation of forming protrusions based the on one or more coupling points included in each of the unit structures, and the one or more coupling points may be points related to coupling of the one or more elastic sheets.

The one or more coupling points may be points of two sides that face each other among a plurality of sides constituting each unit structure.

The one or more elastic sheets may include a first elastic sheet attached to a first surface of the auxetic and a second elastic sheet attached to a second surface opposite to the first surface, the through-hole may be formed to have a hole shape having a preset diameter and may connect the first surface and the second surface, and the protrusion may be formed to protrude outward from each of the first surface and the second surface.

The forming of the stretchable substrate may further include bringing the first elastic sheet into contact with the first surface, filling each of the through-holes with an elastic body in a direction downward from the second surface and curing the elastic body and the first elastic sheet, and bringing the second elastic sheet into contact with the second surface and curing the elastic body and the second elastic sheet.

The forming of the stretchable substrate may further include filling each of the through-holes, which corresponds to one of the unit structures, with an elastic body, applying an adhesive on both surfaces of each elastic body, bringing the one or more elastic sheets on both of the surfaces of the elastic body coated with the adhesive, and performing curing.

The elastic body may include an elastic material having an elastic force and may be made of the same material as the elastic sheet.

The protrusions may include a first protrusion provided to protrude from a first surface of the auxetic and a second protrusion provided to protrude from a second surface of the auxetic, and the forming of the stretchable substrate may include applying an adhesive to each of the first protrusion and the second protrusion, bringing the one or more elastic sheets into contact with the first protrusion and the second protrusion coated with the adhesive, and performing curing.

According to another aspect of the present disclosure, there is provided a stretchable substrate having improved stretch uniformity including an auxetic which includes a plurality of unit structures and has a negative Poisson's ratio, and one or more elastic sheets attached to both surfaces of the auxetic.

The auxetic may include at least one of a through-hole and a protrusion at each of one or more coupling points included in each of the plurality of unit structures, and the one or more coupling points may be points related to coupling of the one or more elastic sheets.

The stretchable substrate may further include an elastic body provided to fill the through-hole and bonded to the one or more elastic sheets.

The elastic body may include an elastic material having an elastic force and may be made of the same material as the elastic sheet.

According to still another aspect of the present disclosure, there is provided a method of manufacturing a flexible electronic device including forming a stretchable substrate on which an auxetic including a plurality of unit structures is formed, and positioning a flexible electrode on the stretchable substrate, wherein the forming of the stretchable substrate includes forming the auxetic which includes the plurality of unit structures, each of which has a shape corresponding to a re-entrant structure, and attaching one or more elastic sheets to the auxetic to form the stretchable substrate.

According to yet another aspect of the present disclosure, there is provided a flexible electronic device including a stretchable substrate and a flexible electrode formed on the stretchable substrate, wherein the stretchable substrate includes an auxetic including a plurality of unit structures and having a negative Poisson's ratio, and one or elastic sheet attached to both surfaces of the auxetic, the auxetic includes at least one of a through-hole and a protrusion at each of one or more coupling points included in each of the plurality of unit structures, and the one or more coupling points are points related to coupling of the one or more elastic sheets.

Other concrete matters of the present disclosure are included in the detailed description and accompanying drawings of the specification.

BRIEF DESCRIPTION OF THE DRAWINGS

Now, various aspects will be described with reference to the accompanying drawings and like reference numerals collectively designate like elements. In the following embodiments, for the purpose of description, various specific details are suggested to provide overall understanding of one or more aspects. However, it is obvious that the aspects may be embodied without the specific details.

FIGS. 14A and 14B show exemplary diagrams illustrating processes of manufacturing a stretchable substrate based on an auxetic including a protrusion according to another embodiment of the present disclosure.

DETAILED DESCRIPTION OF EXEMPLARY EMBODIMENTS

Figure 1:
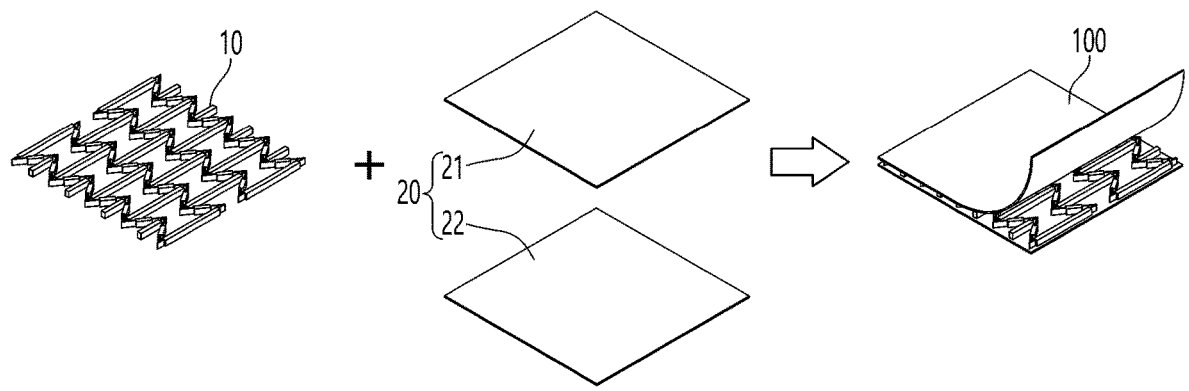
FIG. 1 shows a schematic diagram illustrating a stretchable substrate having improved stretch uniformity according to one embodiment of the present disclosure.

Various embodiments and/or aspects will be disclosed with reference to the accompanying drawings. In the following description, for the purpose of description, various specific details are disclosed to provide overall understanding of one or more aspects. However, those skilled in the art may understand that the aspect(s) may be embodied without having the specific details. The following description and accompanying drawings thoroughly describe specific exemplary aspects of one or more aspects. However, the aspects are provided for an illustrative purpose, some of various methods in principles of the various aspects may be used, and the descriptions are intended to include all of the aspects and equivalents thereof. Specifically, the "embodiment," "example," "aspect," "illustration," and the like used in the present specification may not be interpreted as a described arbitrary aspect or design being better than or more advantageous than other aspects or designs.

Hereinafter, in the drawings, the same or similar elements are denoted by the same reference numerals even though they are depicted in different drawings, and a detailed description of the same or similar elements will be omitted. In addition, in the following description of the embodiments disclosed herein, a detailed description of related arts will be omitted when it is determined that the gist of the embodiments disclosed herein may be obscured. Also, the accompanying drawings are used to help easily understand the embodiments disclosed herein, and it should be understood that the technical idea disclosed herein are not limited by the accompanying drawings.

It will be understood that, although the terms first, second, etc. may be used herein to describe various elements or components, these elements or components should not be limited by these terms. These terms are only used to distinguish one element or component from another element or component. Thus, a first element or component discussed below could be termed a second element or component without departing from the technical idea of the present disclosure.

Unless otherwise defined, all terms (including technical and scientific terms) used in the present specification may be used as the same meaning which may be commonly understood by the person with ordinary skill in the art to which the present disclosure belongs. It will be further understood that terms defined in commonly used dictionaries should not be interpreted in an idealized or excessive sense unless expressly and specifically defined.

Further, the term "or" is intended to mean not exclusive "or" but implicational "or." That is, when it is not specifically designated or unclear in the context, "X uses A or B" is intended to refer to one of natural implicational substitutions. In other words, "X uses A or B" may be applied to any case of "X uses A," "X uses B," or "X uses both A and B." Further, it should be understood that the term "and/or" used in the present specification indicates and includes all possible combinations of one or more items among related listed items.

It should be understood that the term "comprise" and/or "comprising" means existence of the corresponding feature and/or element but does not exclude the existence or addition of one or more other features, elements, and a group thereof. In addition, when not separately defined or not clear in terms of the context that a singular form is indicated, it should be construed that the singular form generally means "one or more" in the present specification and the claims.

It will be understood that when an element is referred to as being "connected" or "coupled" to another element, it can be directly connected or coupled to another element or intervening elements may be present. In contrast, when an element is referred to as being "directly connected" or "directly coupled" to another element, there are no intervening elements present.

In addition, a term "module," "unit," or "portion" of an element used herein is assigned or incorporated for convenience of specification description, and the suffix itself does not have a distinguished meaning or function.

It will be understood that when an element or layer is referred to as being "on" or "above" another element or layer, the element or layer can be directly on or above another element or layer or intervening elements or layers may be present. In contrast, when an element is referred to as being "directly on" or "directly above," there are no intervening elements or layers.

Spatially relative terms, such as "below," "beneath," "lower," "above," "upper," and the like, may be used herein for ease of description to describe one element or feature's relationship to another element(s) or feature(s) as illustrated in the drawings. It will be understood that the spatially relative terms are intended to encompass different orientations of the device in use or in operation, in addition to the orientation depicted in the figures.

For example, when the device in the figures is turned over, elements described as "below" or "beneath" or "under" other elements or features would then be oriented "above" the other elements or features. Thus, the exemplary term "below" can encompass both an orientation of above and below. Since an element may be oriented in another direction, the spatially-relative terms may be interpreted in accordance with the orientation of the element.

The objects and effects of the present disclosure and technical solutions for accomplishing these may be apparent with reference to embodiments to be described below in detail along with the accompanying drawings. In the description of the present disclosure, when it is determined that detailed descriptions of known functions or configurations unnecessarily obscure the subject matter of the present disclosure, the detailed descriptions will be omitted. The terms as set forth herein are defined in consideration of the functions of the present disclosure and may vary according to customs or the intent of a user and an operator.

However, the present disclosure is not limited to the embodiments set forth below and may be embodied in various other forms. The present embodiments may be provided to make the present disclosure complete and to enable the person skilled in the art to fully understand the category of the present disclosure. The present disclosure may be defined only by the category described in the appended claims. Thus, the definition may be made based on the entirety of the description of the present specification.

FIG. 1 shows a schematic diagram illustrating a stretchable substrate 100 having improved stretch uniformity according to one embodiment of the present disclosure. The stretchable substrate 100 may include an auxetic 10 which has a negative Poisson's ratio and is formed through a plurality of unit structures. The auxetic 10 may refer to a mechanical metamaterial having a mechanism for exhibiting a new mechanical function, which did not previously exist, through a plurality of unit structures. For example, the auxetic 10 related to the mechanical metamaterial may have a structure that expands in a direction perpendicular to a typical stretching direction in nature Specifically, the auxetic 10 included in the stretchable substrate 100 may include the plurality of unit structures. In this case, since each unit structure is provided with one or more shapes, the auxetic 10 may have a negative Poisson's ratio. A Poisson's ratio may refer to a ratio of transverse strain to longitudinal strain when a tensile force is applied to a material to stretch the material in a specific direction. In other words, the Poisson's ratio may refer to a strain between a transverse direction and a longitudinal direction.

Most of materials have a positive Poisson's ratio because a strain in a stretching direction and a strain in a lateral direction of a material have different signs when a tensile force is applied in a minor axis. However, when a material is designed to form a specific lattice structure, a negative Poisson's ratio can be realized macroscopically even when a structural material has a positive Poisson's ratio.

Figure 2:
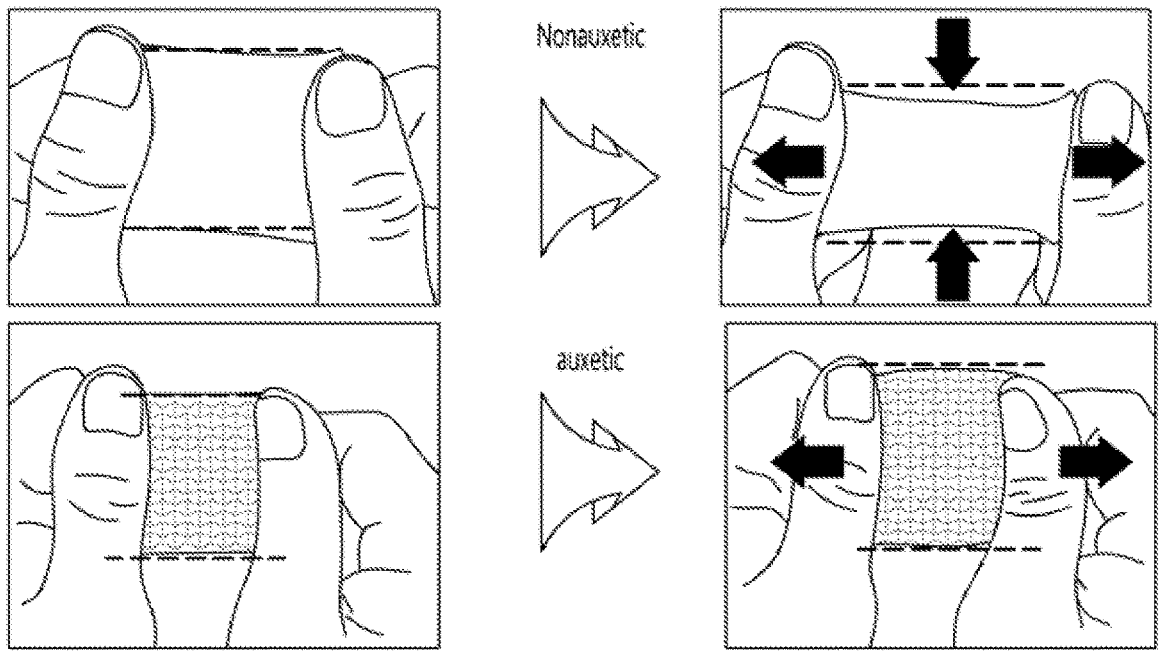
FIG. 2 shows exemplary diagrams for describing deformation in one axial direction occurring in relation to an external force generated in another axial direction when a stretchable substrate according to one embodiment of the present disclosure is implemented through an auxetic structure.

For a specific example, referring to FIG. 2, in a material having a general non-auxetic structure, when stress is applied in a transverse direction, the material expands in the transverse direction and contracts in a longitudinal direction at the same time. That is, a Poisson's ratio of longitudinal deformation and transverse deformation due to a vertical stress generated inside the material may be positive.

On the other hand, in a material having an auxetic structure, when stress is applied in a transverse direction, the material may expand in both transverse and longitudinal directions. That is, a Poisson's ratio due to vertical stress generated inside the material may be negative.

According to one embodiment of the present disclosure, the auxetic 10 for forming the stretchable substrate 100 may be formed through a printing process using an elastic material. According to one embodiment, the auxetic 10 may be formed by performing a process of forming an elastic sheet 20 and performing a printing process on one surface of the formed elastic sheet 20. The elastic sheet 20 may be provided to support the auxetic 10 in a process of forming the auxetic 10, may be provided in a shape of a thin film, and may constitute a portion of the stretchable substrate 100 after the printing process. That is, a plurality of unit structures having a specific shape may be formed (or stacked) on an upper portion of the elastic sheet 20 using the elastic sheet 20 as a support through a printing process using an elastic material, thereby forming the auxetic 10.

In addition, according to another embodiment, a printing process may be performed on one surface of a fixing surface, and after curing, the fixing surface is separated, thereby forming the auxetic 10 of the present disclosure. The fixing surface may be provided to temporarily support the auxetic 10 in a process of forming the auxetic 10 and may be separated from the auxetic 10 after the printing process. That is, the auxetic 10 may be formed by performing a printing process using the separate fixing surface different from components constituting the stretchable substrate 100, and the auxetic 10 of the present disclosure may be formed through a process of separating the formed auxetic 10 from the fixing surface.

In other words, the process of forming the auxetic 10 in the present disclosure may include at least one of a process of performing a printing process on the elastic sheet 20 made of a thin elastic body (that is, a process in which an elastic sheet used as a support is included in a stretchable substrate) and a process of forming the auxetic 10 using a flat fixing surface and separating the auxetic 10 from the corresponding fixing surface after curing to form the auxetic (that is, a process of separating a separate support to prepare only the auxetic).

The printing process in the present disclosure may be a process of printing a target object with a designed circuit pattern through an inkjet printer, a laminator, or the like and may refer to a roll-to-roll process of forming (or stacking) a specific lattice structure (that is, a plurality of unit structures having a specific shape) through a stretchable or elastic material. Such a printing process may refer to a process using a device such as an inkjet device, a pneumatic dispenser, a screw dispenser, a screen printing device, a bar coater, or a spray printing device. The detailed description of the devices used in the above-described printing process is merely an example, and the present disclosure is not limited thereto.

That is, the auxetic 10 constituting the stretchable substrate 100 of the present disclosure may be formed through a printing process using an elastic material. In other words, through the printing process, it is possible to form the auxetic corresponding to an interval and size of several tens to several hundreds of microns. Thus, it is possible to provide a high degree of freedom in design and a high degree of freedom in material selection and concurrently provide high efficiency in a large-area process.

As described above, unlike general materials, the auxetic 10 of the present disclosure may refer to a material that has a negative Poisson's ratio, that is, the material is designed such that a transverse strain and a longitudinal strain have the same sign. In other words, the stretchable substrate 100 of the present disclosure is formed through the auxetic 10 which is a mechanical metamaterial designed in a specific lattice structure, thereby controlling the stretchable substrate 100 to have a negative Poisson's ratio or a strain in a direction perpendicular to a stretching direction. The Poisson's ratio is an inherent characteristic in a material but is controllable by forming a specific structure in the material.

An auxetic structure in which a Poisson's ratio is adjustable to a negative value may include, for example, an auxetic structure including a plurality of unit structures corresponding to a re-entrant structure as shown in FIGS. 1 to 4.

Figure 3:
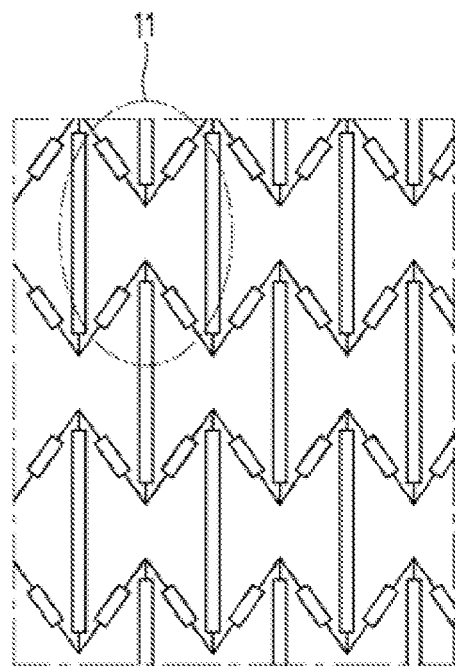
FIG. 3 is an exemplary diagram illustrating an auxetic structure including a plurality of unit structures having a re-entrant structure according to one embodiment of the present disclosure.

FIG. 3 is an exemplary diagram illustrating an auxetic 10 provided with a re-entrant structure. When the auxetic 10 is provided with the re-entrant structure, a shape of each of a plurality of unit structures may be a bowtie shape as shown in FIG. 3. When an external force is applied to the corresponding auxetic 10 in a longitudinal direction (that is, when the corresponding auxetic 10 expands in one direction), while each of the plurality of unit structures is spread, internal stress may be applied in a transverse direction so that the corresponding auxetic 10 may have a negative Poisson's ratio. The auxetic 10 may expand in a transverse axial direction in response to an external force generated in a longitudinal axial direction. Each of the plurality of unit structures may cause the deformation of the auxetic in one axial direction in response to an external force generated in another axial direction. In other words, since each of the plurality of unit structures provided in the auxetic 10 is implemented through the bowtie shape, when an external force is applied in one axial direction, a strain in another axial direction may be controlled.

That is, a stretchable substrate 100 implemented through the auxetic 10 may be a substrate to which unique mechanical properties that do not exist in nature are given by using a new structure. The stretchable substrate 100 may have high applicability in various fields. For example, the stretchable substrate 100 of the present disclosure may be applied to a flexible device, a wearable device, or the like and used to maintain electrical or physical properties of an element against external stress. For another example, when the stretchable substrate 100 of the present disclosure is used in a display field, the stretchable substrate 100 may support deformation in a multidimensional axis direction under various conditions in addition to a fixed display that is folded or rolled in a single direction. Thus, higher variability may be provided to improve a degree of freedom in design and also secure mechanical stability against an external force.

In a display implemented through the stretchable substrate 100 having such an auxetic structure, a negative Poisson's ratio may be controlled in terms of the entirety of the substrate, but when the substrate expands or contracts, stress may be non-uniform for each pixel section. Specifically, in the case of a stretchable substrate using an auxetic structure, when the stretchable substrate is stretched, a strain may be controlled in an in-place direction perpendicular to a stretching direction, but respective pixel sections may have different elongations.

That is, since the respective pixel sections have different elongations, stress may be non-uniformly distributed according to each area constituting a surface, which may result in distortion of an image output on the display.

Figure 4:
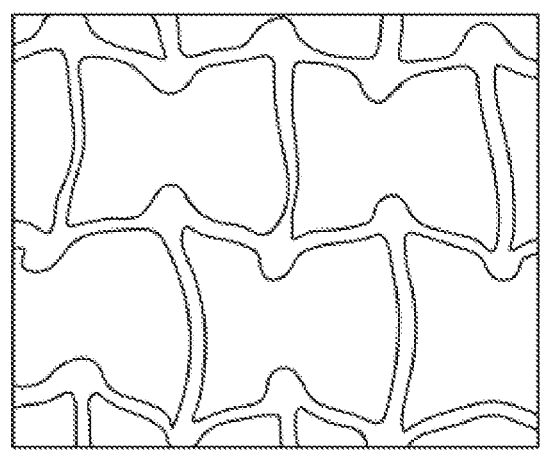
FIG. 4 is a diagram exemplarily illustrating that an elongation distribution is not uniform when an auxetic is stretched according to one embodiment of the present disclosure.
Figure 5:
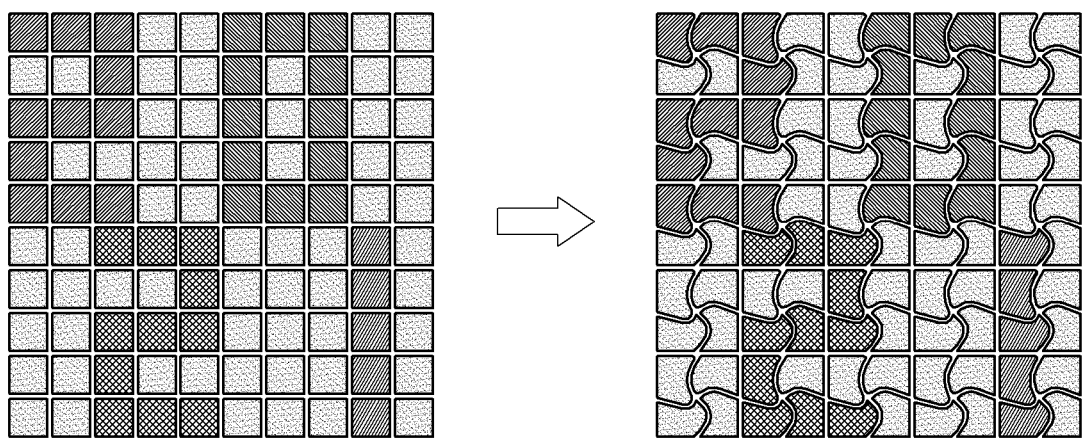
FIG. 5 shows diagrams exemplarily illustrating display distortion that occurs when an elongation distribution is not uniform within a substrate according to one embodiment of the present disclosure.

Referring to FIGS. 4 and 5 for more detailed description, when the stretchable substrate 100 is implemented through the auxetic 10 having the re-entrant structure, since a Poisson's ratio is controllable to a negative value, the stretchable substrate 100 may expand or remain unchanged in one axial direction in response to an external force generated in another axial direction on a plane. That is, when expansion and contraction occur in one axial direction, expansion and contraction may be caused in an in-plane direction perpendicular to the stretching direction.

However, when the auxetic 10 having the re-entrant structure is simply embedded in an elastic substrate to implement a stretchable substrate, stress may be non-uniform for each section constituting a surface. For example, when two elastic sheets are in full contact with both surfaces of the auxetic 10 including a plurality of unit structures to form a stretchable substrate, and when stretching occurs in one direction, strains applied to various areas of the unit structures may be different. Therefore, stress may not be uniform for each pixel section. For example, as shown in FIG. 4, while spreading in response to stretching in one direction, each unit structure may be stretched in an in-plane direction perpendicular to the one direction. However, in this case, since a motion of each unit structure is different for each section, each unit structure may be distorted or rotated, and thus, an overall strain may be different for each pixel section.

That is, as shown in FIG. 4, when each auxetic 10 expands or contracts in one axial direction, according to a shape of each unit structure (for example, a bowtie shape corresponding to a re-entrant structure), distortion may be caused in another axial direction, or overall distortion may be caused. Accordingly, when a display is implemented using the stretchable substrate 100 implemented through the corresponding auxetic, as shown in FIG. 5, each square pixel may be distorted, and thus, an overall image may be distorted.

Additionally, there is a risk of affecting the performance of display-related elements disposed adjacent to a substrate surface. Thus, as the mechanical separation of an element positioned on a stretchable substrate is accelerated, there is a risk of reducing a lifetime of the element. In particular, when the performance of an element is directly affected by a shape of a surface as in a display or a solar cell, a solution to a corresponding issue may be required.

According to the present disclosure, since the stretchable substrate 100 is implemented through the auxetic 10, when the stretchable substrate 100 is provided to have a negative Poisson's ratio, it is possible to minimize distortion for each pixel section of the stretchable substrate 100. Specifically, in the stretchable substrate 100 of the present disclosure, each elastic sheet may be selectively bonded to a portion of each of both surfaces of the auxetic 10 to control the uniformity of a strain for each pixel of the corresponding stretchable substrate 100

Figure 6:
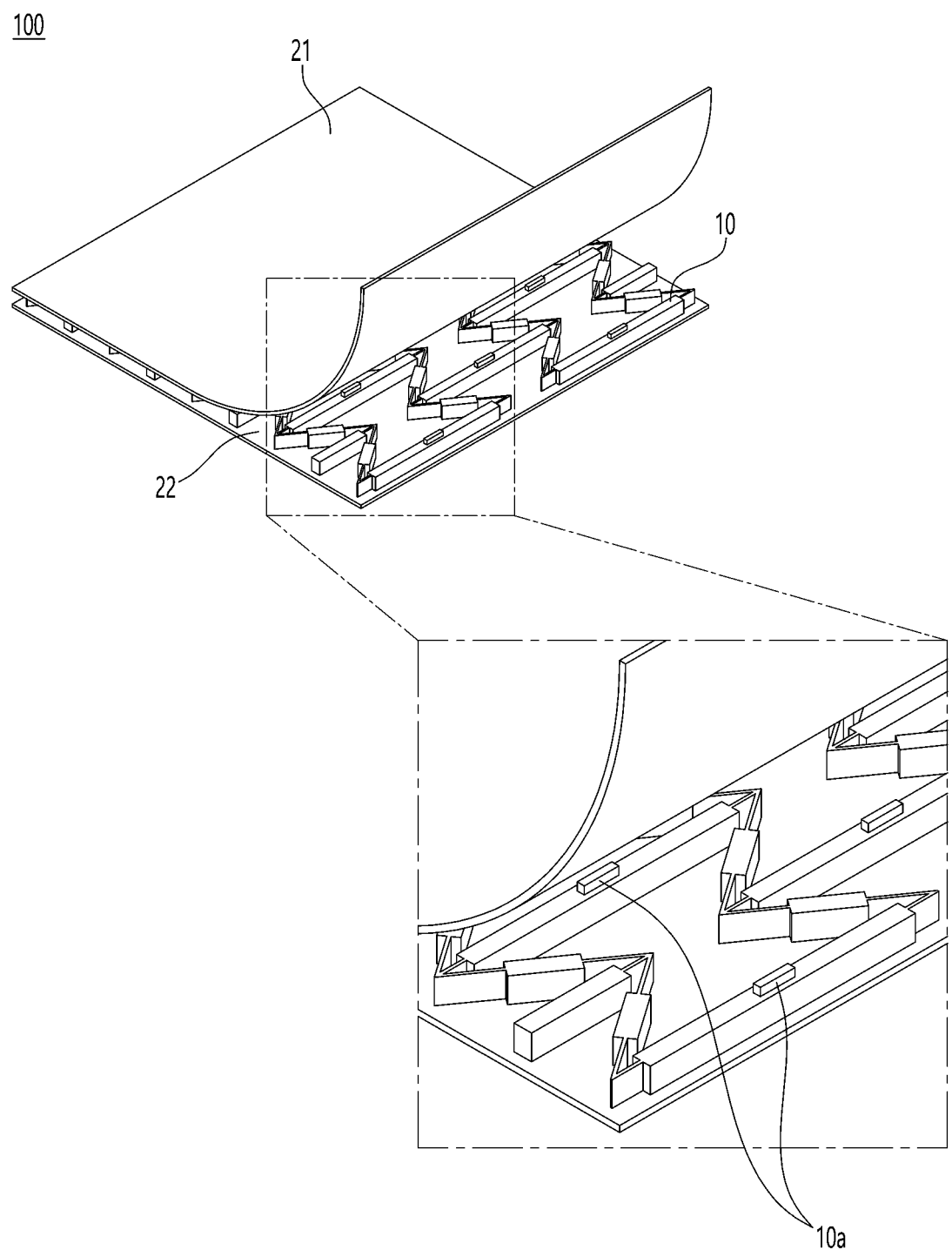
FIG. 6 shows diagrams exemplarily illustrating a stretchable substrate formed through selective bonding of an auxetic having a re-entrant structure and an elastic substrate according to one embodiment of the present disclosure.

Specifically, the stretchable substrate 100 having improved stretch uniformity may be implemented through selective bonding of the auxetic 10 and one or more elastic sheets 20. Here, the selective bonding means that each of two elastic sheets is not entirely bonded to correspond to the total area of one of both surfaces of the auxetic 10 implemented through a plurality of unit structures having a specific shape and each of the plurality of unit structures is bonded to a portion of each elastic sheet. For example, as shown in FIG. 6, the selective bonding may mean that each elastic sheet is bonded to a partial area of each of both surfaces of an auxetic 10, that is, a coupling point 10a.

That is, the stretchable substrate 100 of the present disclosure may be formed by coupling one or more elastic sheets 20 in relation to the coupling point 10a according to a provided shape of a unit structure. For example, when a shape of the unit structure is a shape corresponding to a re-entrant structure, the stretchable substrate 100 may be formed by selectively bonding one or more elastic sheets 20 based on the coupling point 10a of the auxetic 10.

In other words, in the stretchable substrate 100 of the present disclosure, both surfaces of the auxetic 10 may be partially and selectively bonded to each elastic sheet rather than entirely bonded to each elastic sheet. Accordingly, a selectively bonded portion can apply a uniform strain to an entire substrate when expanding and contracting. Thus, by improving flatness, pixel distortion of a stretchable display can be reduced, element performance can be maintained, and element separation can be minimized, thereby improving the overall stability of a stretchable electronic device.

That is, the stretchable substrate 100 may have high applicability in various fields, and in particular, in relation to a stretchable display field, the stretchable substrate 100 may have a uniform strain for each pixel section. Thus, it is possible to minimize distortion occurring when the stretchable substrate 100 expands or contracts in one direction. More specific methods of manufacturing the stretchable substrate 100 of the present disclosure, structural features thereof, and effects thereof will be described below with reference to FIGS. 6 to 10.

Figure 7:
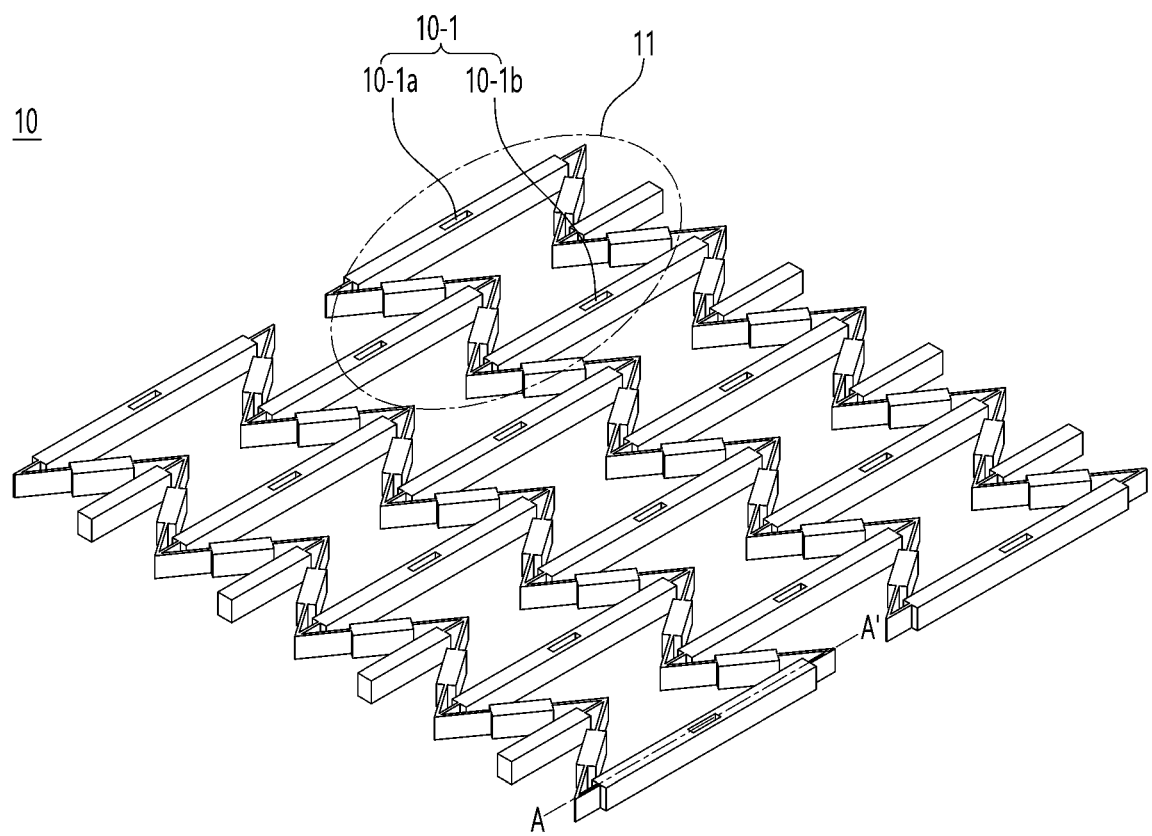
FIG. 7 is a diagram exemplarily illustrating a through-hole formed in an auxetic having a re-entrant structure according to one embodiment of the present disclosure.
Figure 8:
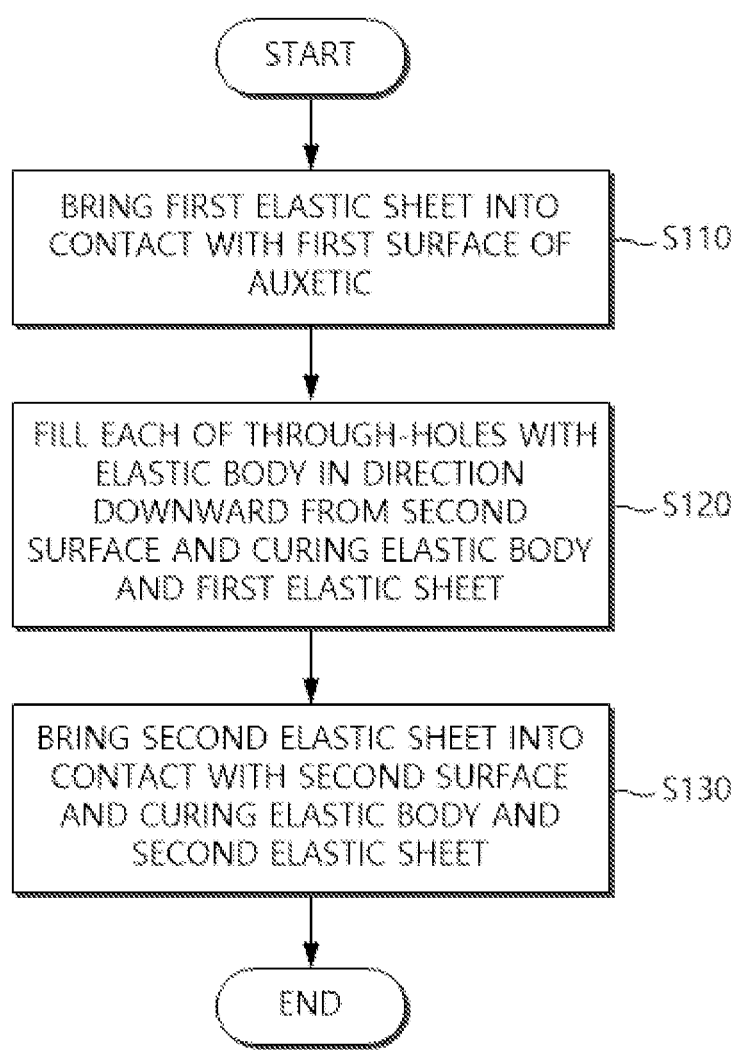
FIG. 8 is a flowchart exemplarily illustrating a method of manufacturing a stretchable substrate based on an auxetic having a through-hole according to one embodiment of the present disclosure.
Figure 9:
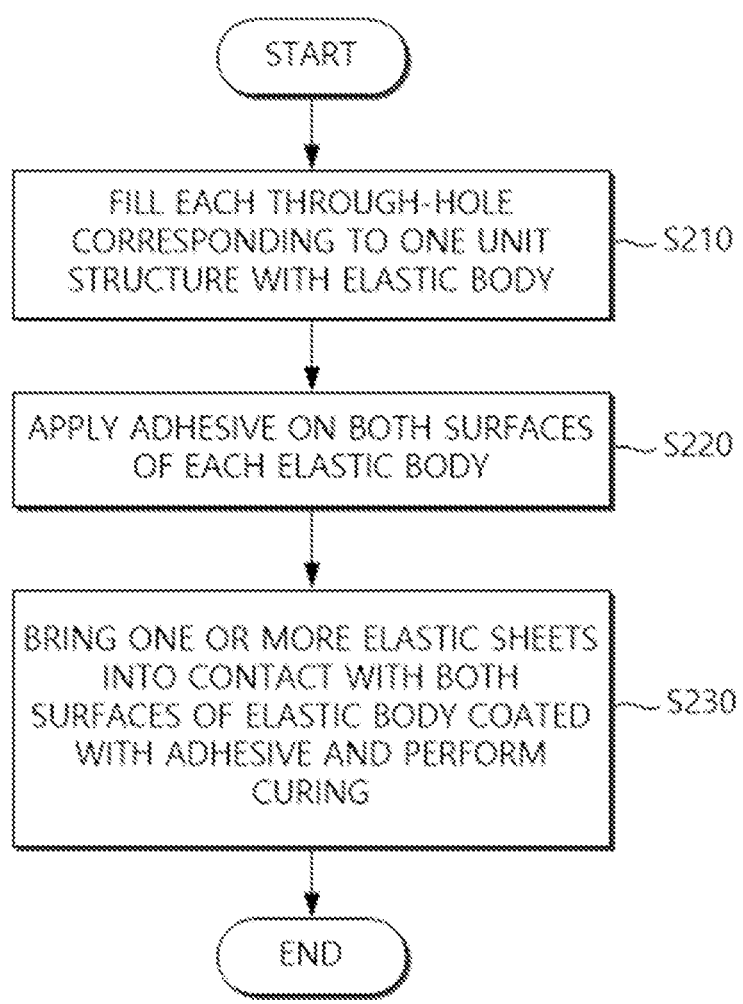
FIG. 9 is a flowchart exemplarily illustrating a method of manufacturing a stretchable substrate based on an auxetic having a through-hole according to another embodiment of the present disclosure.
Figure 10:
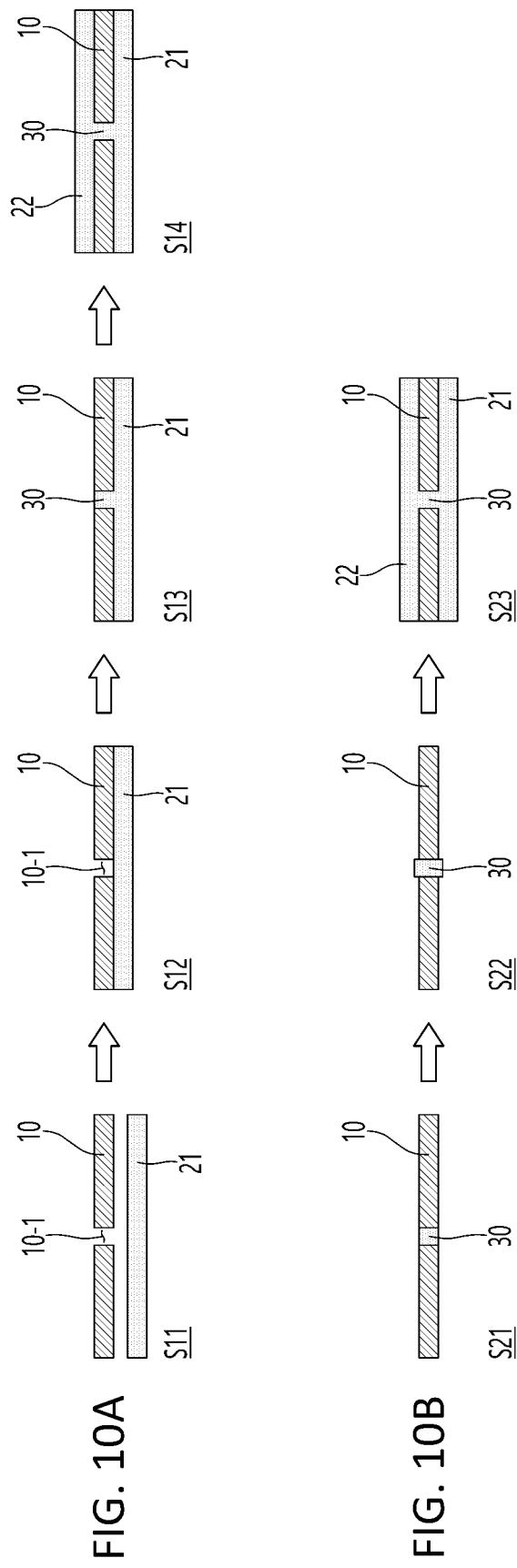
FIGS. 10A and 10B show exemplary diagrams illustrating processes of manufacturing a stretchable substrate based on an auxetic having a through-hole according to one embodiment of the present disclosure.
Figure 11:
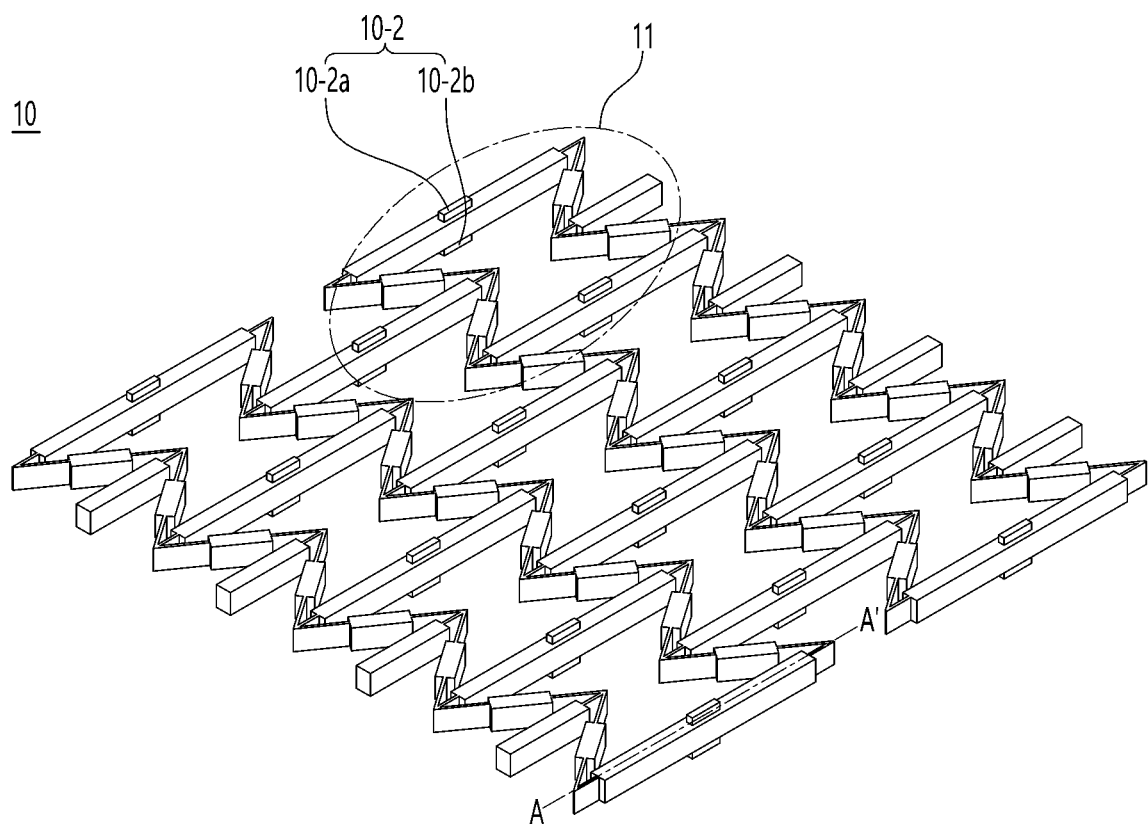
FIG. 11 is a diagram exemplarily illustrating a protrusion provided in an auxetic having a re-entrant structure according to another embodiment of the present disclosure.
Figure 12:
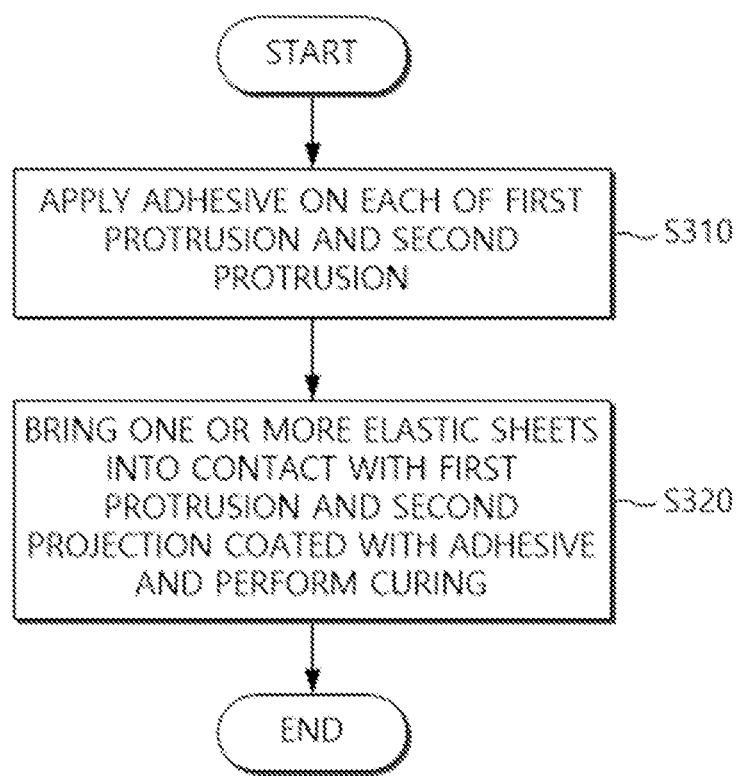
FIG. 12 is a flowchart exemplarily illustrating a method of manufacturing a stretchable substrate based on an auxetic including a protrusion according to one embodiment of the present disclosure.
Figure 13:
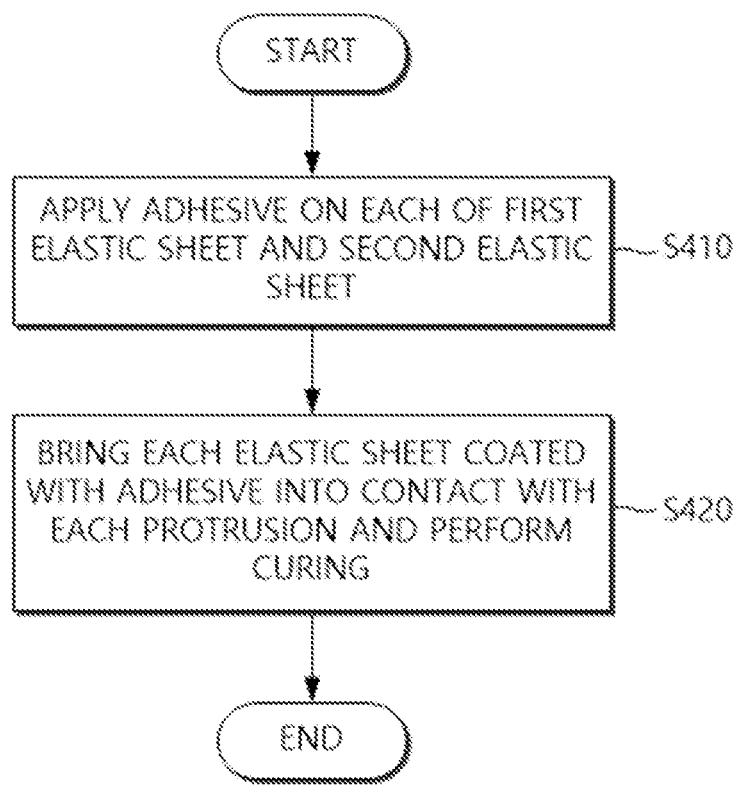
FIG. 13 is a flowchart exemplarily illustrating a method of manufacturing a stretchable substrate based on an auxetic including a protrusion according to another embodiment of the present disclosure.

FIG. 6 shows diagrams exemplarily illustrating a stretchable substrate formed through selective bonding of an auxetic having a re-entrant structure and an elastic substrate according to one embodiment of the present disclosure. FIG. 7 is a diagram exemplarily illustrating a through-hole formed in an auxetic having a re-entrant structure according to one embodiment of the present disclosure. FIG. 8 is a flowchart exemplarily illustrating a method of manufacturing a stretchable substrate based on an auxetic having a through-hole according to one embodiment of the present disclosure. FIG. 9 is a flowchart exemplarily illustrating a method of manufacturing a stretchable substrate based on an auxetic having a through-hole according to another embodiment of the present disclosure. FIGS. 10A and 10B show exemplary diagrams illustrating processes of manufacturing a stretchable substrate based on an auxetic having a through-hole according to one embodiment of the present disclosure. FIG. 11 is a diagram exemplarily illustrating a protrusion provided in an auxetic having a re-entrant structure according to another embodiment of the present disclosure. FIG. 12 is a flowchart exemplarily illustrating a method of manufacturing a stretchable substrate based on an auxetic including a protrusion according to one embodiment of the present disclosure. FIG. 13 is a flowchart exemplarily illustrating a method of manufacturing a stretchable substrate based on an auxetic including a protrusion according to another embodiment of the present disclosure. FIGS. 14A and 14B show exemplary diagrams illustrating processes of manufacturing a stretchable substrate based on an auxetic including a protrusion according to another embodiment of the present disclosure.

As shown in FIG. 6, a stretchable substrate 100 may include an auxetic 10 including a plurality of unit structures and one or more elastic sheets 20. For example, the plurality of unit structures constituting the auxetic 10 may be provided to have a shape corresponding to a re-entrant structure. FIG. 6 exemplarily illustrates a case in which, when the auxetic is formed in the re-entrant structure, each of the plurality of unit structures has a shape corresponding to the re-entrant structure.

The stretchable substrate 100 of the present disclosure may include the auxetic 10 including the plurality of unit structures having a bowtie shape and one or more elastic sheets 20 attached to both surfaces of the auxetic 10. In the present disclosure, one or more elastic sheets 20 may be formed to have a predetermined thickness or less and bonded to one or more surfaces of the auxetic 10. The elastic sheet may be provided to have a certain elastic force or more so as to expand and contract.

As shown in FIG. 6, the stretchable substrate 100 may be formed by bonding or coupling the auxetic 10 to each of one or more elastic sheets based on coupling points 10a of each of the plurality of unit structures constituting the auxetic 10. Here, the coupling point 10a may be a point related to the coupling of the auxetic 10 and one or more elastic sheets. For example, the coupling point 10a may be a point on each unit structure, which is related to a coupling portion coupled to each of the elastic sheets. That is, as shown in FIG. 6, the coupling point 10a may be a point related to bonding with each of one or more elastic sheets 20 and may be a point of each of sides that face each other among a plurality of sides constituting each unit structure.

For a specific example, referring to FIG. 6, the plurality of unit structures constituting the auxetic 10 may include a first unit structure 11. For example, the coupling point 10a may be positioned at each of two sides that face each other among one or more sides constituting the first unit structure 11.

That is, each of two sides that face each other among sides constituting each unit structure may be regarded as the coupling point 10a, and the auxetic 10 and a first elastic sheet 21 may be selectively bonded to each other based on the coupling point 10a of each unit structure. In one embodiment, although FIG. 6 illustrates only the coupling point 10a positioned in a direction toward the first elastic sheet 21 for convenience of description, it will be apparent to those skilled in the art that the corresponding coupling point 10a may be equally provided in a direction toward a second elastic sheet 22 (a downward direction in the drawing). For example, coupling points may refer to four points formed at sides that face each other on an upper surface and a lower surface of one unit structure.

In other words, on both surfaces of the auxetic 10, only portions corresponding to the coupling points 10a of each unit structure 11 may be coupled to the first elastic sheet 21 and the second elastic sheet 22 to constitute the stretchable substrate 100. In this case, as described above, the elastic sheet 20 and the auxetic 10 are selectively bonded to maintain a constant distance and thus constitute the stretchable substrate 100. Accordingly, the elastic sheet 20 constituting a surface moves uniformly in directions of one axis (for example, an x-axis) and another axis (for example, a y-axis) in response to stretching in a specific axial direction, and more uniform strain control is possible.

As described above, one or more elastic sheets may be bonded based on coupling points 10a of an auxetic 10 including a plurality of unit structures having a shape corresponding to a re-entrant structure, and a method of forming a stretchable substrate 100 may include forming the auxetic 10 including the plurality of unit structures, and attaching one or more elastic sheets to the auxetic 10 to form a stretchable substrate 100.

Specifically, the forming of the auxetic 10 may include identifying at least one coupling point 10a on each unit structure. Here, as described above, the coupling point is a point related to bonding with each of the one or more elastic sheets 20 and may be a point of each of both sides that face each other among a plurality of sides constituting the unit structure.

In addition, the forming of the auxetic 10 may include forming at least one of a through-hole and a protrusion corresponding to each unit structure based on at least one coupling point. Specifically, the forming of the auxetic 10 may include forming the through-holes based on one or more coupling points included in the plurality of unit structures. In addition, the forming of the auxetic 10 may include forming the protrusions based on one or more coupling points included in the plurality of unit structures.

That is, in the case of the auxetic 10 including the plurality of unit structures having a bowtie shape, a through-hole 10-1 or a protrusion 10-2 may be formed based on the coupling point. In one embodiment, a printing process may be performed on the coupling point 10a of each unit structure so as to include a hole having a preset diameter, thereby forming the auxetic 10 in which the through-hole 10-1 is formed. In other words, the through-hole 10-1 may be provided with a hole shape having a preset diameter. For example, the through-hole 10-1 may be provided with the hole shape to connect a first surface (for example, an upper surface) and a second surface (for example, a lower surface) of the auxetic 10.

In another embodiment, a printing process may be performed on the coupling point 10a of each unit structure so as to include the protrusion 10-2 having a shape protruding outward, thereby forming the auxetic 10 in which the protrusion is formed on the coupling point 10a. In other words, the protrusion 10-2 may be formed to protrude outward from each of the first surface (for example, the upper surface) and the second surface (for example, the lower surface).

The through-hole 10-1 or the protrusion 10-2 formed in the auxetic 10 of the present disclosure may facilitate selective bonding of one or more elastic sheets 20 based on the coupling point 10a. Each of the plurality of unit structures is provided with a shape corresponding to the re-entrant structure, and thus, the through-hole 10-1 or the protrusion 10-2 is formed at the coupling point 10a. A detailed process of forming the stretchable substrate 100 through selective bonding of the elastic sheet and each of the through-hole 10-1 and the protrusion 10-2 will be described below with reference to FIGS. 7 to 10.

As shown in FIG. 7, an auxetic 10 may be provided with through-holes 10-1. Specifically, the through-holes 10-1 may be formed in each of a plurality of unit structures included in the auxetic 10 so as to correspond to coupling points 10a. For example, a first through-hole 10-1a and a second through-hole 10-1b may be formed based on the coupling points 10a of a first unit structure 11. The through-hole 10-1 may be provided with a hole shape passing through a first surface (for example, an upper surface) and a second surface (for example, a lower surface) of the auxetic 10. The through-hole 10-1 may be filled with an elastic body 30, and a stretchable substrate may be formed by bonding of one or more elastic sheets 20 based on the corresponding elastic body 30.

According to one embodiment of the present disclosure, as shown in FIG. 8, an operation of forming a stretchable substrate 100 may include operation S110 of bringing a first elastic sheet into contact with a first surface of an auxetic 10. In addition, the operation of forming the stretchable substrate 100 may include operation S120 of filling each of through-holes with an elastic body in a direction downward from a second surface and curing the elastic body and the first elastic sheet. In addition, the operation of forming the stretchable substrate 100 may include operation S130 of bringing a second elastic sheet into contact with the second surface and curing the elastic body and the second elastic sheet. FIGS. 10A and 10B exemplarily show cross-sectional views taken along line A-A' shown in FIG. 7.

Referring to FIG. 10A for more detailed description, in operation S11, a first elastic sheet 21 may be positioned in a direction downward from the auxetic 10, and in operation S12, the first elastic sheet 21 may be brought into contact with the first surface of the auxetic 10. The first surface of the auxetic 10 may refer to one surface related to a downward direction, and the second surface thereof may refer to the other surface related to an upward direction. Here, the contact may mean that there is no space between the auxetic 10 and the first elastic sheet 21.

In addition, in operation S13, the elastic body 30 may fill the through-hole 10-1 formed in the coupling point 10a of the auxetic 10. Specifically, the elastic body 30 in a liquid state may be supplied in an upper direction in the drawing, that is, in a direction downward from the second surface opposite to the first surface in contact with the first elastic sheet 21. In this case, since the first elastic sheet 21 is provided in contact with the first surface in an upward direction from the first surface, the elastic body 30 may be cured inside the corresponding through-hole 10-1 without being discharged in a direction opposite to the through-hole 10-1. The elastic body 30 may be coupled to the through-hole 10-1 through curing. Curing in the present disclosure may be for bonding (or attaching) materials and may refer to curing performed for 2.5 hours at a temperature of, for example, 80° C. However, the description of a specific numerical value of curing to be performed is merely an example, and the present disclosure is not limited thereto.

According to one embodiment, the elastic body 30 may be made of an elastic material having an elastic force. This elastic body 30 may be implemented using the same material as the elastic sheet 20. The elastic body 30 in a liquid state may fill the through-hole 10-1 formed in the coupling point 10a and may be coupled to the first elastic sheet 21 through a curing process. In this case, since the elastic body 30 and the elastic sheet 20 are made of the same material, it is possible to secure transparency that is greater than or equal to preset transparency used in a display field. For example, when the elastic body 30 and the elastic sheet 20 are made of different materials, it may be difficult to secure visibility due to a difference in refractive index between the materials. In the present disclosure, the elastic body 30 and the elastic sheet 20 include the same material. For example, when the auxetic 10 includes a mechanical metamaterial of polydimethylsiloxane (PDMS), the elastic sheet 20 attached to the auxetic 10 may be made of the same PDMS material. That is, a difference in refractive index between the auxetic 10 and the elastic sheet 20 can be minimized to secure transparency, thereby providing an effect of improving visibility in an application field of a display.

In addition, in operation S14, the second elastic sheet 22 may be brought into contact with the elastic body 30 in a direction downward from the second surface of the auxetic 10 (that is, the upper direction in the drawing) to perform curing related to the coupling of the elastic body 30 and the second elastic sheet 22. Accordingly, the first elastic sheet 21 and the second elastic sheet 22 may be coupled to one surface and the other surface of the elastic body 30, respectively. That is, each of the first elastic sheet 21 and the second elastic sheet 22 may be provided by being cured based on the elastic body 30 filling the through-hole 10-1.

According to another embodiment of the present disclosure, as shown in FIG. 9, a method of forming a stretchable substrate 100 may include operation S210 of filling through-holes 10-1, each of which corresponds to one of unit structures, with elastic bodies, operation S220 of applying an adhesive on both surfaces of each elastic body, and operation S230 of bringing one or more elastic sheets into contact with both surfaces of the elastic body coated with the adhesive and performing curing.

Referring to FIG. 10B for more detailed description, in operation S21, the elastic body 30 may fill the through-hole 10-1 formed in the auxetic 10. In addition, in operation S22, the adhesive may be applied on each of an upper surface and a lower surface of the elastic body 30. In other words, the adhesive may be applied on both surfaces of the elastic body 30. In addition, in operation S23, a first elastic sheet 21 and a second elastic sheet 22 may be brought into contact with both surfaces of the elastic body 30 coated with the adhesive to perform curing. Here, the curing may be curing for maximizing the adhesive performance of the adhesive.

Although, in the examples as described above, a process of selectively bonding the auxetic 10 and one or more elastic sheets 20 has been exemplarily described based on a cross-sectional view related to one through-hole 10-1 formed in one unit structure, the examples are merely examples for understanding of the present disclosure, and it will be apparent to those skilled in the art that the present disclosure is not limited thereto. That is, the stretchable substrate 100 of the present disclosure may be formed by attaching the elastic sheets to the upper and lower surfaces based on the through-hole 10-1 formed in the coupling point 10a of each of the plurality of unit structures.

As described above, when a shape of each of the plurality of unit structures included in the auxetic 10 is a shape (for example, a bowtie shape) corresponding to a re-entrant structure, the through-hole 10-1 may be formed in relation to the coupling point of each unit structure, and thus, the elastic sheet 20 and the auxetic 10 may be selectively bonded to maintain a constant distance, thereby constituting the stretchable substrate 100. Accordingly, the elastic sheet 20 related to a surface moves uniformly in directions of one axis (for example, an x-axis) and another axis (for example, a y-axis) in response to stretching in a specific axial direction, and more uniform strain control is possible.

As shown in FIG. 11, an auxetic 10 may be provided with protrusions 10-2. Specifically, the protrusions 10-2 may be provided in each of a plurality of unit structures included in the auxetic 10 so as to correspond to a coupling point 10a. For example, a first protrusion 10-2a and a second protrusion 10-2b may be formed based on the coupling point 10a of a first unit structure 11. Specifically, the protrusions 10-2 may include the first protrusion 10-2a formed to protrude upward from the coupling point 10a and the second protrusion 10-2b formed to protrude downward from the coupling point 10a.

That is, the protrusion 10-2 may be provided with a shape protruding from each of an upper surface and a lower surface of the auxetic 10. An adhesive 31 may be applied on the protrusion 10-2, and the protrusion 10-2 may be bonded to one or more elastic sheets 20 based on the adhesive 31, thereby forming a stretchable substrate 100.

According to one embodiment of the present disclosure, as shown in FIG. 12, an operation of forming a stretchable substrate 100 may include operation S310 of applying an adhesive 31 on each of a first protrusion 10-2a and a second protrusion 10-2b, and operation S320 of bringing one or more elastic sheets 20 into contact with the first protrusion 10-2a and the second projection 10-2b coated with the adhesive 31 and performing curing. FIGS. 14A and 14B exemplarily show cross-sectional views taken along line A-A' shown in FIG. 11.

Referring to FIG. 14A for more detailed description, in operation S31, an auxetic 10 including the first protrusion 10-2a and the second protrusion 10-2b respectively protruding from an upper surface and a lower surface thereof may be provided, and in operation S32, the adhesive 31 may be applied on each protrusion. For example, rollers including an adhesive on a surface thereof may move in a direction toward the upper surface and a direction toward the lower surface of the auxetic 10 to apply the adhesive 31 on the first protrusion 10-2a and the second protrusion 10-2b which are provided to protrude convexly. That is, the adhesive may be applied only on each protrusion provided to protrude from each surface through an adhesive application process using the rollers.

In addition, in operation S33, a first elastic sheet 21 and a second elastic sheet 22 may be brought into contact with the first protrusion 10-2a and the second projection 10-2b coated with the adhesive 31 to perform curing. Here, the curing may be curing for maximizing the adhesive performance of the adhesive.

According to another embodiment, as shown in FIG. 13, an operation of forming a stretchable substrate 100 may include operation S410 of applying an adhesive 31 on each of a first elastic sheet 21 and a second elastic sheet 22, and operation S420 of bringing each elastic sheet, on which the adhesive 310, into contact with each protrusion and perform curing.

Referring to FIG. 14B for more detailed description, in operation S41, an auxetic 10 including a first protrusion 10-2a and a second protrusion 10-2b respectively protruding from an upper surface and a lower surface thereof may be provided, and in operation S42, the adhesive 31 may be provided to be applied on each of a first elastic sheet 21 and a second elastic sheet 22. In addition, in operation S43, in a state in which the second elastic sheet 22 is in contact with the first protrusion 10-2a, and the first elastic sheet 21 is in contact with the second protrusion portion 10-2b, curing may be performed to couple each elastic sheet to each protrusion related to each surface of the auxetic. That is, the second protrusion 10-2b and the first protrusion 10-2a may be respectively coupled to the first elastic sheet 21 and the second elastic sheet 22 coated with the adhesive 31, thereby constituting a stretchable substrate 100.

As described above, when a shape of each of a plurality of unit structures included in an auxetic 10 is a shape (for example, a bowtie shape) corresponding to a re-entrant structure, a protrusion 10-2 may be provided in relation to a coupling point 10a of each unit structure, and thus, an elastic sheet and the auxetic 10 may be selectively bonded to maintain a constant distance, thereby constituting a stretchable substrate 100. Accordingly, an elastic sheet 20 related to a surface moves uniformly in directions of one axis (for example, an x-axis) and another axis (for example, a y-axis) in response to stretching in a specific axial direction, and more uniform strain control is possible.

Accordingly, the stretchable substrate 100 of the present disclosure may be formed by coupling one or more elastic sheets 20 in relation to the coupling point 10a corresponding to a provided shape of the unit structure. The auxetic 10 may be selectively bonded to one or more elastic sheets 20 based on the coupling point 10a of the auxetic 10 to form the stretchable substrate 100.

In other words, in the stretchable substrate 100 of the present disclosure, both surfaces of the auxetic 10 may be partially and selectively bonded to each elastic sheet rather than entirely bonded to each elastic sheet. Accordingly, a selectively bonded portion can apply a uniform strain to an entire substrate when expanding and contracting. Thus, by improving flatness, pixel distortion of a stretchable display can be reduced, element performance can be maintained, and element separation can be minimized, thereby improving the overall stability of a stretchable electronic device.

That is, the stretchable substrate 100 may have high applicability in various fields, and in particular, in relation to a stretchable display field, the stretchable substrate 100 may have a uniform strain for each pixel section. Thus, it is possible to minimize distortion occurring when the stretchable substrate 100 expands or contracts in one direction.

According to various embodiments of the present disclosure, it is possible to provide a stretchable substrate in which a stretchable substrate having a negative Poisson's ratio is provided to control a strain in an in-plane direction of perpendicular to a stretching direction and concurrently to minimize a distortion and a warpage by uniformizing an elongation distribution in the substrate.

Effects of the present disclosure may not be limited to the above, and other effects of the present disclosure will be clearly understandable to those having ordinary skill in the art from the disclosures provided below together with accompanying drawings.

Although the embodiments of the present disclosure have been described with reference to the accompanying drawings, it should be understood that those skilled in the art can carry out other modifications without changing the technical spirit or essential features of the present disclosure. Therefore, it should be understood that the embodiments described herein are illustrative and not restrictive in all aspects.

Particular implementations described in the present disclosure are exemplary and do not limit the scope of practiced embodiments. For conciseness of the specification, the description of conventional electronic configurations, control systems, software, and other functional aspects of systems may be omitted. Moreover, connections of lines or connecting elements between components shown in the accompanying drawings may represent functional connections and/or physical or circuit connections and may represent various kinds of replaceable or additional functional connections, physical connections, or circuit connections in an actual device. Furthermore, when not specifically described using terms such as "essentially" or "importantly," elements described in the specification may not be necessarily required for application of the present disclosure.

It will be appreciated that a specific order or a hierarchical structure of steps in the presented processes and methods is one example of exemplary approaches. It will be appreciated that the specific order or the hierarchical structure of the steps in the processes within the scope of the present disclosure may be rearranged based on design priorities. Appended method claims provide elements used in various steps in a sample order, but this does not mean that the method claims are limited to the presented specific order or hierarchical structure.

The description of the presented embodiments is provided so that those skilled in the art of the present disclosure may use or implement the present disclosure. Various modifications of the embodiments will be apparent to those skilled in the art of the present disclosure, and general principles defined herein can be applied to other embodiments without departing from the scope of the present disclosure. Therefore, the present disclosure is not limited to the embodiments presented herein but should be interpreted within the widest range which is associated with the principles and new features presented herein.

What is claimed is:

1. A method of manufacturing a stretchable substrate having improved stretch uniformity, the method comprising:
   forming an auxetic including a plurality of unit structures, each of which has a shape corresponding to a re-entrant structure, which comprises:
      a first through-hole positioned on a first side of the re-entrant structure;
      a second through-hole positioned on a second side of the re-entrant structure, the first side and the second side face each other among a plurality of sides constituting the re-entrant structure;
      a first protrusion positioned though the first through-hole and protruded outward from each of an upper surface of the first side and a bottom surface of the first side;
      a second protrusion positioned though the second through-hole and protruded outward from each of an upper surface of the second side and a bottom surface of the second side; and
   attaching one or more elastic sheets to the auxetic and forming a stretchable substrate, wherein the one or more elastic sheets are directly bonded to the first protrusion and the second protrusion, and the one or more elastic sheets are not directly bonded to an upper surface or a bottom surface of any side among the plurality of sides constituting the re-entrant structure.

2. The method of claim 1, wherein, in response to an external force generated in one axial direction, each of the plurality of unit structures causes deformation of the auxetic in another axial direction.

3. The method of claim 1, wherein the forming of the auxetic includes performing a printing process using an elastic material.

4. The method of claim 1, wherein:
   the one or more elastic sheets include a first elastic sheet positioned above a first surface of the auxetic and a second elastic sheet positioned below a second surface opposite to the first surface;
   each through-hole of the first and second through-holes is formed to have a hole shape having a preset diameter and connects the first surface and the second surface; and
   the protrusion is formed to protrude outward from each of the first surface and the second surface.

5. The method of claim 1, further comprising:
   bringing the first elastic sheet to be positioned above the first surface;
   filling each through-hole of the first and second through-holes with an elastic body in a direction downward from the second surface and curing the elastic body and the first elastic sheet; and
   bringing the second elastic sheet to be positioned below the second surface and curing the elastic body and the second elastic sheet.

6. The method of claim 1, further comprising:
   filling each through-hole of the first and second through-holes with an elastic body;
   applying an adhesive on both surfaces of each elastic body; and
   bringing the one or more elastic sheets on both of the surfaces of the elastic body coated with the adhesive and performing curing.

7. The method of claim 6, wherein the elastic body includes an elastic material having an elastic force and is made of the same material as the elastic sheet.

8. The method of claim 1, further comprising:
   applying an adhesive to each of the first protrusion and the second protrusion, bringing the one or more elastic sheets into contact with the first protrusion and the second protrusion coated with the adhesive, and performing curing.

* * * * *